United States Patent [19]

Debroux

[11] Patent Number: 5,278,518
[45] Date of Patent: Jan. 11, 1994

[54] AMPLIFYING CIRCUIT WITH EXPONENTIAL GAIN CONTROL

[75] Inventor: Jean-François Debroux, St. Etienne de St Geoirs, France

[73] Assignee: Thomson Composants Militaires et Spatiaux, Courbevoie, France

[21] Appl. No.: 934,751

[22] Filed: Oct. 8, 1992

[30] Foreign Application Priority Data

Feb. 8, 1991 [FR] France ............... 91 01484

[51] Int. Cl.$^5$ ............................................. H03G 3/30
[52] U.S. Cl. ..................................... 330/279; 330/129
[58] Field of Search ............... 330/85, 110, 129, 131, 330/279; 307/492, 493

[56] References Cited

U.S. PATENT DOCUMENTS

| | | | |
|---|---|---|---|
| 4,263,560 | 4/1981 | Ricker | 330/129 |
| 4,514,702 | 4/1985 | Zogg | 330/85 X |
| 4,816,772 | 3/1989 | Klotz | |
| 5,034,701 | 7/1991 | Debroux | 330/279 X |

FOREIGN PATENT DOCUMENTS

| | | |
|---|---|---|
| 0003509 | 8/1979 | European Pat. Off. |
| 0220043 | 4/1987 | European Pat. Off. |
| 0287063 | 10/1988 | European Pat. Off. |
| 0391786 | 10/1990 | European Pat. Off. |
| 2545535 | 4/1977 | Fed. Rep. of Germany |
| 3012965 | 10/1980 | Fed. Rep. of Germany |

Primary Examiner—Steven Mottola
Attorney, Agent, or Firm—Oblon, Spivak, McClelland, Maier & Neustadt

[57] ABSTRACT

The invention relates to an amplifying circuit with controlled gain, the gain of which is an exponential function of a gain control voltage. The circuit includes two identical amplifiers A1 and A2, the first constituting the basic amplifying cell of the circuit (input Ie, output Is), and the second receiving a reference signal (Iref). The output from the second amplifier, which is the product of the input Iref times the gain G, serves as input to a feedback control loop for the gain G of the amplifiers. This loop receives a set point voltage Vc with a view to establishing a gain G which is an exponential function of Vc. A large-gain differential amplifier AD constitutes the core of this loop: the differential voltage between its inputs tends to be held at zero by the feedback control loop. According to the invention, an element (FTL) with logarithmic transfer function is inserted into the loop between the output of the second amplifier A2 and the input of the large-gain differential amplifier AD.

9 Claims, 7 Drawing Sheets

AMPLIFYING CIRCUIT WITH EXPONENTIAL GAIN CONTROL The invention relates to an electrical circuit for amplifying signals, and more particularly an amplifying circuit whose gain can be controlled at will through an electrical quantity (current or voltage).

One of the aims of the invention is to produce an amplifier, the control of whose gain is exponential, that is to say, if the electrical control quantity is a signal Vc (voltage) or Ic (current) the gain G will be of the form G=A.exp(Vc) or A.exp(Ic), A being a constant.

The need for such an amplifier is apparent when the gain needs to be varied through a very large dynamic range (for example a variation between 1 and $10^6$).

The normal solution for producing such an amplifier is to insert an element with exponential variation ahead of a gain control input of an amplifier with linear gain control.

However, it is not easy to do this and it is not certain that the amplifier with linear gain control will have a truly linear gain throughout the dynamic range of voltages which will serve to control it; this dynamic range is by assumption sizeable owing to the exponential nature of the control.

Furthermore, there is a need to be certain of the law of variation between the gain control and the gain obtained.

Indeed, in some applications it is not sufficient to know that the gain can vary within a large dynamic range, aided by a control signal with small dynamic range: it may also be necessary accurately to ascertain the gain obtained.

SUMMARY OF THE INVENTION

The invention provides a solution resolving these problems of exponential gain control, and making it possible also to solve, if desired, problems of dependence of the gain on temperature.

According to the invention, part of a structure known from Patent FR 2 645 370 is used in an original way by noting that this structure enables an exponential gain control to be produced from a logarithmic function inserted at an appropriate location in the circuit.

Now, the logarithmic function is a function which can be produced at little cost in integrated circuits, with the aid of bipolar junctions; the logarithmic law of current/voltage variation is well known, and, moreover, the law of dependence on temperature is also well known.

The invention therefore provides an amplifying circuit with gain controlled by an electrical set point signal (current or voltage), comprising two identical controlled-gain amplifiers both receiving the same gain control signal, the first amplifier receiving a signal to be amplified and providing an amplified output signal, the second receiving a fixed reference signal and providing at its output a signal proportional to this reference signal and to the gain of the amplifiers, the circuit further comprising a gain set point signal input and a feedback control loop receiving the output from the second amplifier and establishing the said gain control signal as a function of the set point signal, this loop comprising at least one large-gain differential amplifier whose differential input tends to be held at zero by the feedback control loop, characterized in that a circuit element with logarithmic transfer function is inserted into the feedback control loop between the output of the second amplifier and the input of the large-gain differential amplifier.

This element with logarithmic transform function essentially establishes a voltage or a current which is either proportional to the logarithm of the signal applied at its input (and this signal is a fixed reference voltage Vref or current Iref multiplied by the gain G of the amplifiers), or more generally a linear function of the logarithm of this signal.

In a simple example, the element with logarithmic transfer function establishes a signal proportional to the logarithm of the output signal G.Vref or G.Iref from the second amplifier; this output signal (of the form p.Log(G.Vref) or p.Log(G)+constant) is applied to an input of the large-gain differential amplifier, and the set point signal Vc is applied to another input of this differential amplifier.

In another example, the difference between the set point signal Vc and the logarithm of the output signal from the second amplifier is effected in the element with logarithmic transfer function itself. This transfer function is then a linear function of the logarithm of the output signal from the second amplifier. More precisely, it will be possible for this linear function to be a linear combination of this logarithm and the set point signal; it will generally be of the form Vc−p.Log(G)+constant, where p is a constant. This function will preferably be applied in differential form between the inputs of the large-gain differential amplifier.

In both cases, the feedback control holds the differential input voltage of the large-gain amplifier substantially at zero permanently, producing equality between the set point signal Vc and a term of the form p.Log(G) or p.Log(G)+constant. It follows that the gain is an exponential function of the set point signal.

The logarithmic law will preferably be obtained through a PN junction, the voltage across the terminals of which is proportional to the logarithm of the current which crosses it.

Preferably, the second amplifier provides a current of the form I2=G.Iref or I2=G.Vref depending on whether the reference signal is a voltage or a current, and it is this current I2 which will be applied to the PN junction. The voltage across the terminals of the junction will be a logarithmic function of the applied current.

The accuracy of the exponential function obtained is related to the quality (very good and highly reproducible) of the logarithmic transfer function, and to the accuracy of pairing of the amplifiers (very good if the amplifiers are constructed in an identical manner on the same integrated circuit substrate).

In practice, the logarithmic function established by the PN junctions is likewise proportional to the absolute temperature T. The temperature will therefore come into the exponential function relating the desired gain G to the set point signal Vc.

If, however, it is arranged for the set point signal applied to the input of the differential amplifier to itself also be proportional to the absolute temperature, a temperature-independent exponential gain control will be obtained, the parameter T now coming in only to second degree within the gain control.

The electrical signals referred to, whether the reference signal, the set point signal, the signals at the input of the differential amplifier, or any others, can equally be voltages or currents, and are not necessarily all voltages or all currents; it is the practical detail of the production diagrams which dictates whether voltages or currents are to be preferred, it being understood that it is possible easily to pass from one to the other in integrated circuit technology.

In the preferred practical embodiment of the invention, the logarithmic transfer function comprises simply two transistors, one fed by the current I2=G.Iref and the other by a fixed reference current proportional to Iref; the set point signal is a differential voltage applied between the bases of the two transistors, and the output from the logarithmic transfer function is the differential voltage between the emitters.

The transfer function is then of the form:

$$Vc \sim (kT/q)LogG, \text{ or}$$
$$Vc \sim (kT/q)Log(G) + \text{constant}$$

k and q are the conventional physical constants governing the logarithmic voltage/current equation for the base-emitter junctions of transistors.

k: Bolzmann's constant = $1.38 \cdot 10^{-23}$ S.I. units
q: charge of the electron = $1.6 \cdot 10^{-19}$ S.I. units.

Generally, the identical amplifiers do not necessarily have a gain greater than 1; rather, in practice attenuators with variable gain between 0 and 1 will be involved besides. The term amplifier applied to the amplifiers is therefore taken in a generic sense.

BRIEF DESCRIPTION OF THE DRAWINGS

Other characteristics and advantages of the invention will emerge on reading the detailed description which follows and which is given with reference to the attached drawings in which.

DETAILED DESCRIPTION OF THE PREFERRED EMBODIMENTS

Figure 1:
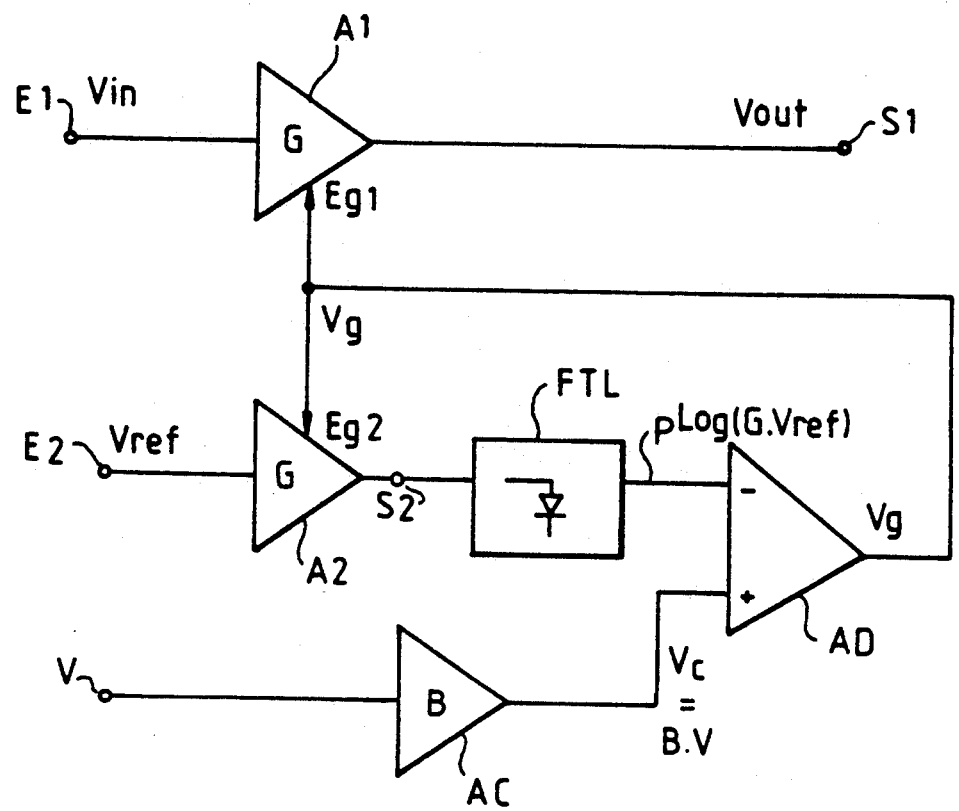
FIG. 1 represents a block diagram of amplifying circuit according to the invention.

The basic diagram of the invention can be seen in FIG. 1.

The amplifying circuit includes an input E1 for an input signal Vin, an output S1 for an output signal Vout. A first amplifier A1 is connected between the input E1 and the output S1. This is the working amplifier of the circuit. The other circuit elements are intended for gain control. The amplifier A1 includes a gain control input (Eg1) and its gain G is a function (not necessarily well known, and not necessarily a simple function, but at the very least a monotonic function) of the gain control signal Vg applied to the input Eg1. The output signal Vout is the product of Vin times the gain G. "Signal" is understood to mean an electrical quantity which can equally well be a voltage or a current; the output signal could for example be a current whereas the input signal is a voltage, in which case the gain G is a transconductance. In the remainder of the explanations relating to FIG. 1, Vin and Vout and the other signal levels referred to will be regarded as voltages.

A second amplifier A2, as identical as possible to the first, possesses an input E2 receiving a fixed continuous reference signal here represented by a reference voltage Vref.

The output S2 from the second amplifier is applied to the input of a circuit element FTL with logarithmic transfer function. The electrical signal applied to this element is G.Vref. The transfer function of the element FTL is of the form p.Log(G.Vref); the signal output by the element FTL is therefore equal, to within a multiplying coefficient p, to the logarithm of the input signal.

The output from the element with logarithmic transfer function is applied to a first input of a large-gain differential amplifier AD which receives on a second input a gain set point signal Vc and which provides on its output the voltage Vg applied to the gain control inputs of the amplifiers A1 and A2.

The gain feedback control loop, comprising the output from the amplifier A2, the element FTL, the differential amplifier AD, and the gain control input of the amplifier A2, tends to permanently return the differential voltage at the input of AD to zero, as long as the gain of AD is sufficiently high. This results in some gain G of the amplifier A2. The gain of the amplifier A1 is a simple copy of the gain G since the amplifiers are identical and receive the same gain control voltage Vg.

In the example represented, the set point voltage Vc arises from an additional amplifier AC which receives at its input a signal V. The amplifier AC has a gain B so that the set point signal Vc applied to the input of the differential amplifier AD is equal to B.V. Here, the transfer function of this auxiliary amplifier can be of voltage amplifier, current amplifier, transconductance, resistance type etc. The gain B can advantageously be proportional to the absolute temperature T, as will be seen further on.

The feedback control loop establishes a balance between the signal B.V and the signal p.Log(G.Vref).

It follows that the gain G of the amplifier A2 takes a values such that:

$$B.V = p\, Log(G.Vref)$$

i.e.

$$G = (1/Vref)\exp(B.V/p)$$

B and p are constants related to the transfer functions of the element FTL and of the additional amplifier AC. Moreover, Vref is a fixed voltage.

A variation in gain of exponential type as a function of a control voltage V is thus obtained.

The gain of the working amplifier A1 is also equal to G and therefore follows the desired control law.

The value of the gain G is known exactly at any moment simply by knowing the value of the control signal V, since the exponential law which links V to G can be very well known if Vref, p and B are known.

The element FTL with logarithmic transfer function can comprise essentially a PN junction; the input signal is the current applied to the junction (the amplifier A2 then having for example a current output providing a current I2=G.Vref) and the output signal is the voltage Vd across the terminals of the junction.

Figure 2:
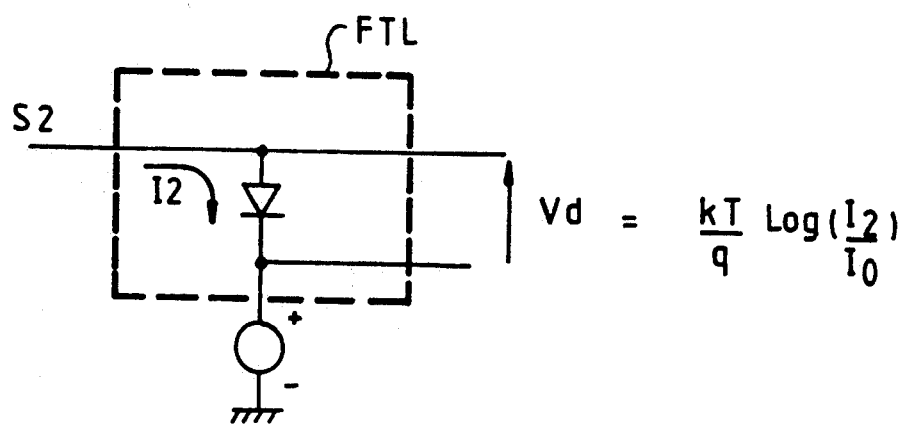
FIG. 2 represents the basic principle of a logarithmic transfer function in an integrated circuit.

FIG. 2 represents a simplified basic diagram of this possibility.

The transfer function is then Vd=kT/qLog(I2/I0), where k, q are physical constants, I0 a constant akin to a current (saturation current for the junction), related to the geometry and to the doping of the junction, and T is the absolute temperature.

If it is assumed that Vref is independent of temperature, as well as the gain adjustment signal V, it is seen that the gain G can be made independent of temperature on condition that provision is made for the amplifier AC to have a gain B proportional to the absolute temperature (B=B0.T), which it is known how to do.

It will be noted that if it is desired to increase the dynamic range of the gain of the amplifying circuit according to the invention without changing the control signal, several identical amplifiers A1, A'1, A"1 can be placed in cascade, all controlled by the same gain control signal Vg arising from AD.

Figure 3:
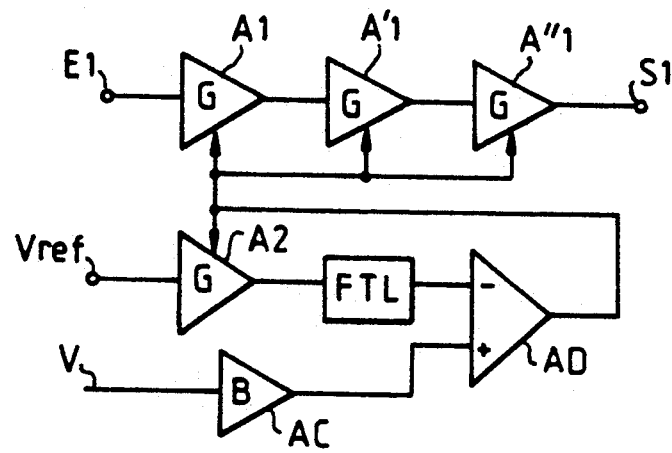
FIG. 3 represents a possible extension of the invention.

FIG. 3 represents a corresponding diagram.

Naturally, the voltages and currents considered can be currents and differential voltages, the amplifiers A1, A2 and the element FTL being circuits with differential inputs and outputs, the amplifier AD furthermore having a differential output. In this case, the term I0 dependent on the technology no longer comes in.

Figure 4:
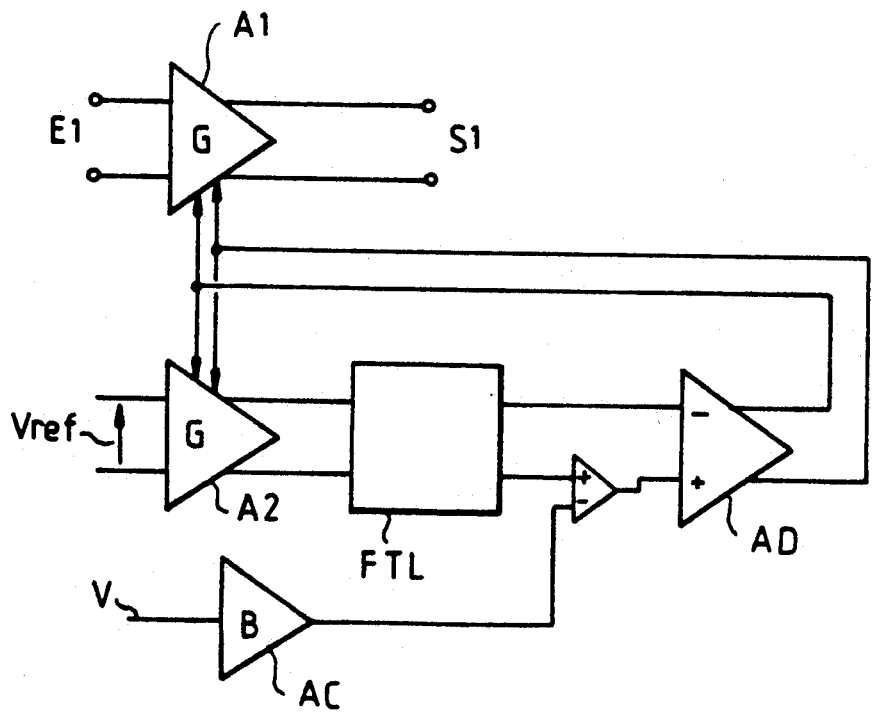
FIG. 4 represents the application to a completely differential structure.

FIG. 4 represents a corresponding diagram.

Generally, it will be noted that the invention makes it possible to limit to a small value the voltages present on the inputs of the differential amplifier: these voltages are, on the one hand, the set point voltage and, on the other hand, the output voltage from a logarithmic element. This would not be the case if an element with exponential function were placed in series between the voltage V and the differential amplifier. Now, it is important that the differential amplifier receives voltages within a limited dynamic range if it is desired that it plays its part correctly in the feedback control.

A detailed embodiment of the invention, applied to bipolar integrated circuit technology, will now be described with reference to the following figures.

Figure 5:
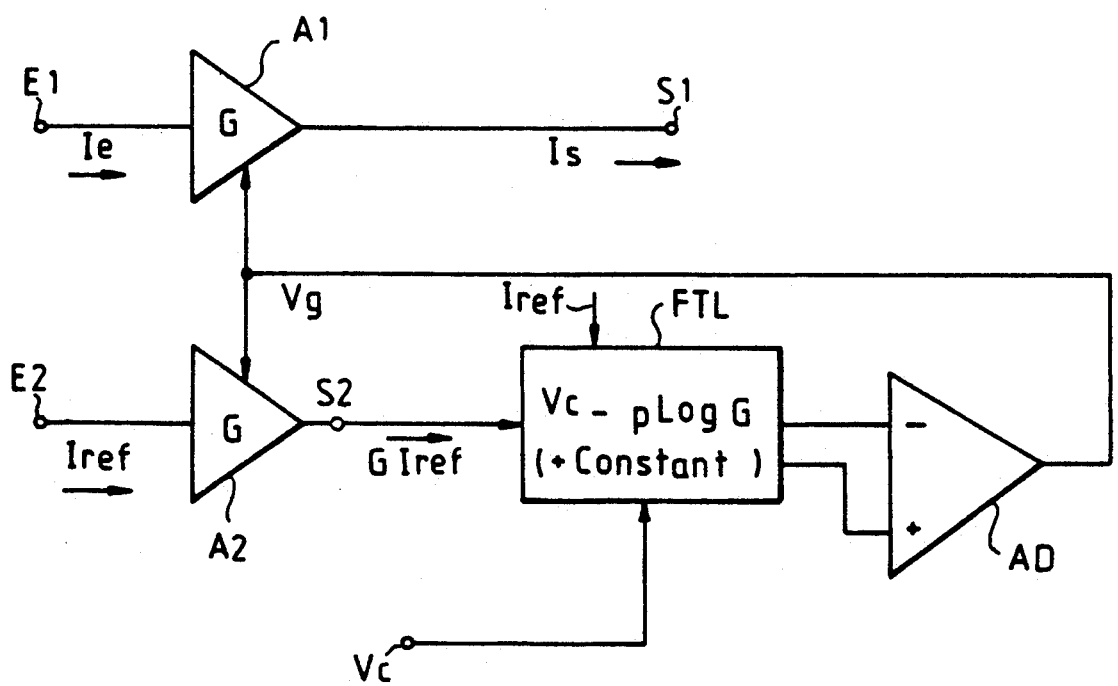
FIG. 5 represents a block diagram of the amplifying circuit of the invention, in a preferred embodiment.

Firstly, FIG. 5 represents a block diagram of the detailed embodiment which will be described next. This block diagram differs formally from that of FIG. 1 but accomplishes exactly the same overall function In this diagram the element with logarithmic function FTL establishes directly the difference between the set point signal Vc and the logarithm of the output signal from the second amplifier.

The element FTL therefore receives both the output signal from the second amplifier and the set point signal Vc, and it establishes an output function of the form: Vc−p.LogG+constant. This function is provided in the form of a differential voltage which is then applied to the input of the large-gain differential amplifier AD. Accordingly, it is easily understood that the main difference with respect to FIG. 1 is purely formal since it consists in effecting a subtraction in the element FTL rather than in the differential amplifier AD which immediately follows it. However, as the reality of the diagram of the following figures corresponds better to the representation of FIG. 5, it has been preferred to start from the latter. The remainder of the diagram is the same as in FIG. 1.

In this example, it is moreover necessary to indicate that current amplifiers, with gain G, are used as amplifiers A1 and A2:

the amplifier A1 receives an input current Ie and provides an output current Is=G.Ie the amplifier A2 receives a reference input current Iref and provides an output current G.Iref.

It is of little importance to know whether the gain control (Vg) is in terms of voltage or current; it is sufficient to know that the output of the differential amplifier AD is linked to a gain control input of the amplifiers A1 and A2 and that the gain varies monotonically as a function of the variations in current or in voltage at the output of the amplifier AD.

As in FIG. 1, it is clear that when the feedback control is operating, that is to say when the gain G attains a value such that the differential input voltage of the amplifier AD is virtually zero, there is an exponential relation between the set point voltage Vc and the gain G, through the formula:

$$Vc - p.Log(G) + constant = 0$$

Figure 6:
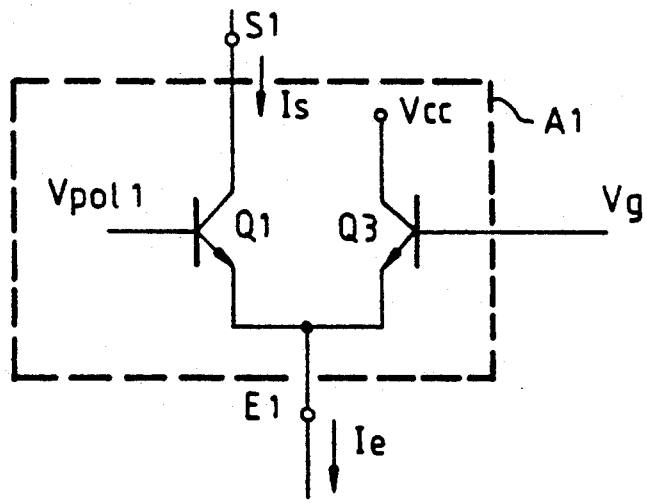
FIG. 6 represents the make-up of the first amplifier in a practical embodiment, here the first and second amplifiers being current amplifiers.

FIG. 6 represents the structure of a cell with variable gain which represents the core of the identical amplifiers A1 and A2.

These cells are current-current amplifiers with gain G. The amplifier A1 can be surrounded by upstream and downstream elements, in order to take into account desired current-voltage or voltage-current conversions, or desired preamplification or postamplification, with known fixed coefficients of conversion and of amplification, but the cells with gain G are what constitute what have been called amplifiers of identical construction with reference to FIG. 1.

In this respect, it must be made clear that amplifiers of identical construction are understood to mean amplifiers which overall undergo the same variation in gain under the control of the same gain modification signal. Accordingly it must be clearly understood that there can be a few differences in construction between the amplifiers A1 and A2, for practical reasons, if the same result is achieved, that is to say if the gains of the amplifiers A1 and A2 vary in the same way.

The cell of FIG. 6 represents more precisely the amplifying cell A1, that is to say the one which receives a gain control signal Vg and an input current Ie to be amplified, in order to provide an output current Is=-G.Ie.

The cell includes two transistors Q1 and Q3 whose emitters are linked to an input E1 of the cell. It is this input which receives the current Ie (represented here by a current leaving the cell). The current Ie is the sum of the emitter currents of the transistors Q1 and Q3. The collector of Q1, linked to the output S1 of the cell, provides the output current Is of the cell (represented as a current returning to the cell). The base of Q1 is biased by a fixed voltage Vpol1. The collector of Q3 is fed with a supply voltage Vcc.

The ratio between the current Is and the current Ie is modulated by a voltage Vg applied to the base of the transistor Q3: depending on the value of Vg the transistor Q3 contributes more or less to the current Ie, and consequently the current Is diminishes or increases more or less accordingly. The current gain G of the cell, which is the ratio between Is and Ie, is therefore directly dependent on Vg. It will be noted that it is less than 1.

Figure 7:
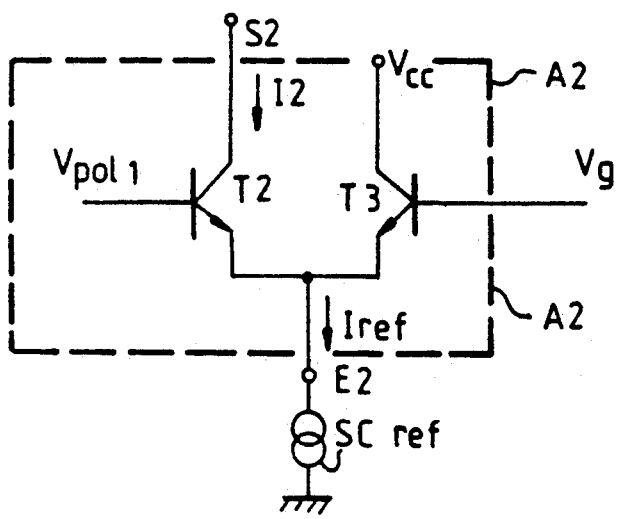
FIG. 7 represents the second amplifier, identical to the first but receiving a different input signal.

In FIG. 7 has been represented the basic cell of the amplifier A2, identical to the cell A1 of FIG. 6, but receiving as input current a reference current Iref instead of the current Ie. The input of the cell is designated E2 and it is linked to a current source SCref. The output is designated S2 and provides a current I2=-G.Iref.

The cell A2 includes two transistors T2 and T3 playing roles identical to those of transistors Q1 and Q3 respectively, and consequently connected like the latter.

The base of T3 receives the same control voltage Vg as the base of Q3. The base of T2 receives the same bias voltage Vpol1 as the base of Q1.

Figure 8:
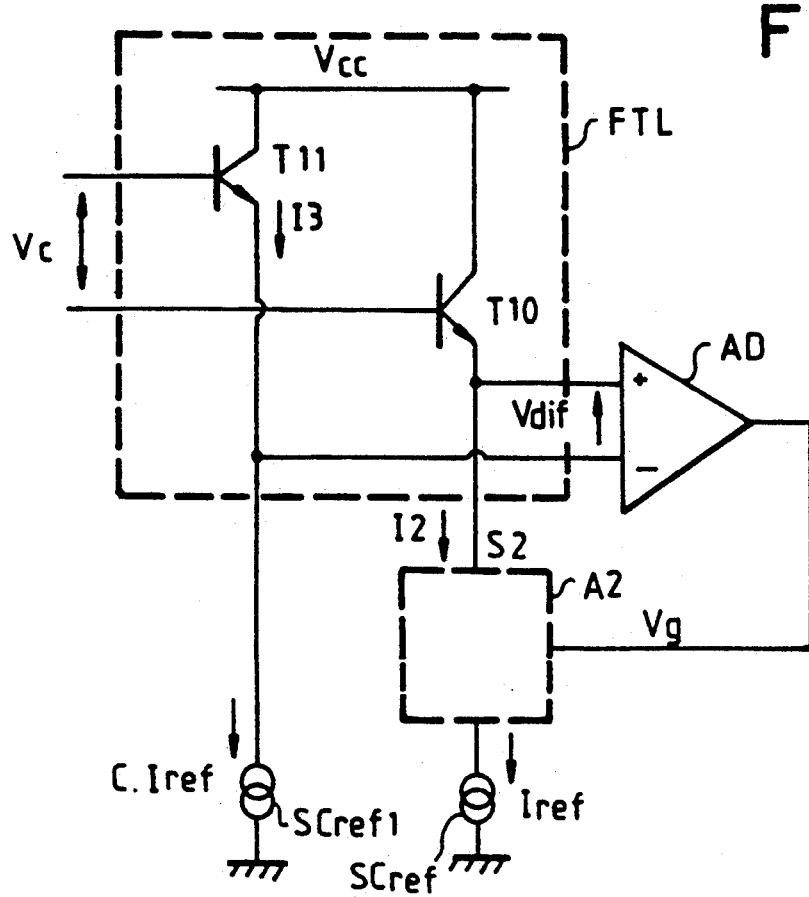
FIG. 8 represents the preferred detailed embodiment of the element with logarithmic transform function.

FIG. 8 represents the preferred embodiment of the element with logarithmic transfer function FTL.

In accordance with the block diagram of FIG. 5, this element FTL receives, on the one hand, the current I2=G.Iref arising from the amplifier A2, and on the other hand, the set point voltage Vc which is here a differential voltage.

The element FTL includes two transistors T10 and T11 whose collectors are linked to a supply voltage (Vcc).

The emitter of T10 is linked to the output S2 of the amplifying cell A2, so that the emitter current of T10 is necessarily the current I2=G.Iref mentioned earlier.

Moreover, the emitter of T11 is linked to a fixed reference current source SCref1, proportional to Iref, with a coefficient of proportionality which will be designated C. The transistor T11 is therefore traversed by an emitter current I3=C.Iref.

It will be recalled that in integrated circuit technology, the establishing of reference currents proportional to one another with coefficients of proportionality which are well known is very well understood.

The current source SCref1 will be established quite simply through a current mirror on the basis of the source SCref which provides the input current for the cell A2.

To summarise, the element FTL comprises transistors T10 and T11 and, in order to supply T11, a current source of value proportional to the input current for the cell A2.

The set point voltage Vc is applied in differential mode directly between the bases of T10 and T11.

The output from the element FTL is the differential voltage Vdif present between the emitters of T10 and T11; this voltage Vdif is applied between the inputs of the large-gain differential amplifier AD.

The voltage Vdif is equal to:

$$Vdif = Vc - (Vbe10 - Vbe11)$$

where Vbe11 and Vbe10 are the base-emitter voltages of transistors T11 and T10. This voltage tends to zero by virtue of the feedback control.

Now, bearing in mind the currents I2 and I3 which cross the transistors, the difference Vbe10−Vbe11 can be written in the form p.Log(I2/I3), that is to say in the form p.Log(G.Iref/C.Iref), or again p.Log(G/C) which can also be written p.Log(G)+constant.

It follows that the element FTL of FIG. 8 clearly fulfils the logarithmic transfer function mentioned in connection with FIG. 5: the control voltage Vc acts, via the amplifier AD, to modify the current I2 until it satisfies the equation Vc=pLog(G)+constant.

It will be noted that p is a coefficient of the type kT/q, and hence proportional to the absolute temperature.

With this practical embodiment it is seen that the gain G of the amplifiers A1 and A2 takes the value $$G = C.exp(Vc/p).$$

The temperature comes into the exponential since p is proportional to T.

If it is wished to make the gain independent of temperature, it is sufficient to make provision, as in FIG. 1, for an amplifier AC of gain B proportional to temperature (B=B0.T) upstream of the gain set point signal input Vc in order to provide the set point voltage Vc to part of a control voltage V.

In this case, we have Vc=B.V=B0.T.V. The gain G becomes $$G = C.exp(B0.T.V/p)$$

which is an exponential function of the control voltage V, independent of temperature (at least to first degree).

It is known how to make amplifiers AC whose voltage gain is proportional to absolute temperature and which provide a differential output signal.

Figure 9:
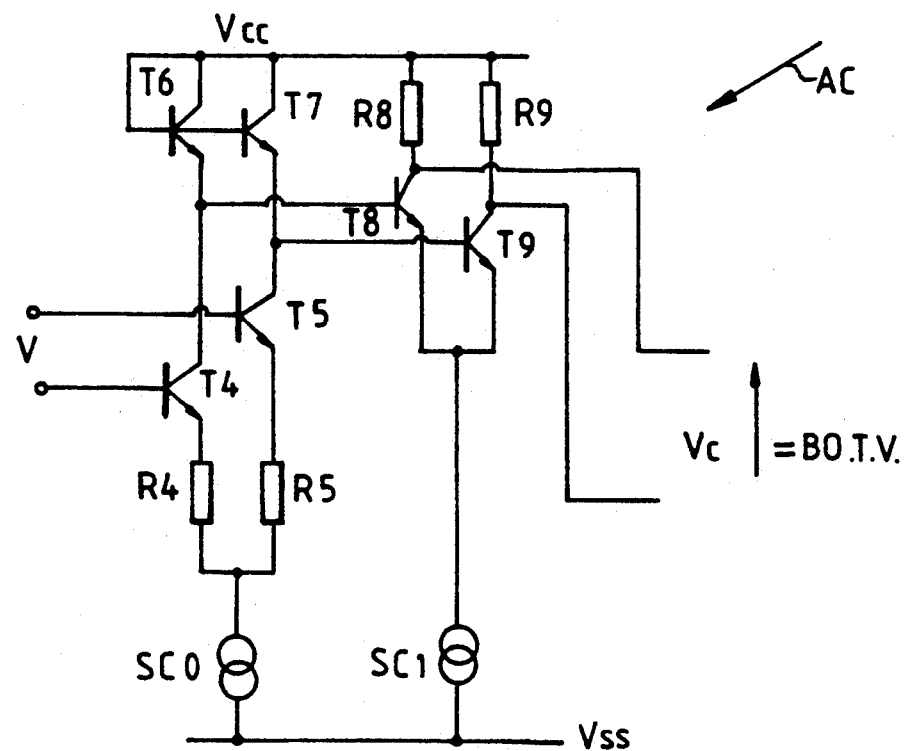
FIG. 9 represents an illustrative embodiment of a control voltage proportional to temperature.

FIG. 9 is a simplified example of such an amplifier AC.

The amplifier AC include two stages. The first comprises a pair of differential branches with two input transistors T4 and T5, two emitter resistors R4 and R5 and two diode-configured load transistors T6 and T7. The differential pair is fed with a constant current produced by a source SC0 linked to the emitters of the input transistors. The input for the amplifier is a control voltage V applied between the bases of the transistors T4 and T5. The output from the first stage is formed as a differential voltage on the emitters of the load transistors T6 and T7. The bases and collectors of the latter are linked to a fixed supply voltage (Vcc for example).

The second stage includes another differential pair with a transistor and a collector resistor respectively in each branch (T8, R8; T9, R9). The emitters are linked to one another and fed by a constant current source SC1. The resistors are linked between the collector and a fixed supply potential (Vcc for example).

The output from the amplifier AC is formed as a differential voltage between the collectors of the transistors T8 and T9. The voltage Vc which appears there is proportional to the adjustment voltage V.

The current sources SC0 and SC1 are not of the same kind. The source SC0 is a temperature-compensated current source. The source SC1 is proportional to absolute temperature.

The potential difference V engenders an imbalance of currents in T4 and T5 and hence a potential difference between the emitters of T6 and T7; this difference, when carried back to the bases of T8 and T9, engenders a new imbalance of currents in T8 and T9, and this imbalance engenders, through the resistors R8 and R9, an output potential difference Vc.

Because the current source SC0 is temperature-compensated whereas SC1 is proportional to the temperature, the output voltage Vc turns out to be, as a good approximation, proportional to absolute temperature and proportional to the voltage V.

Figure 10:
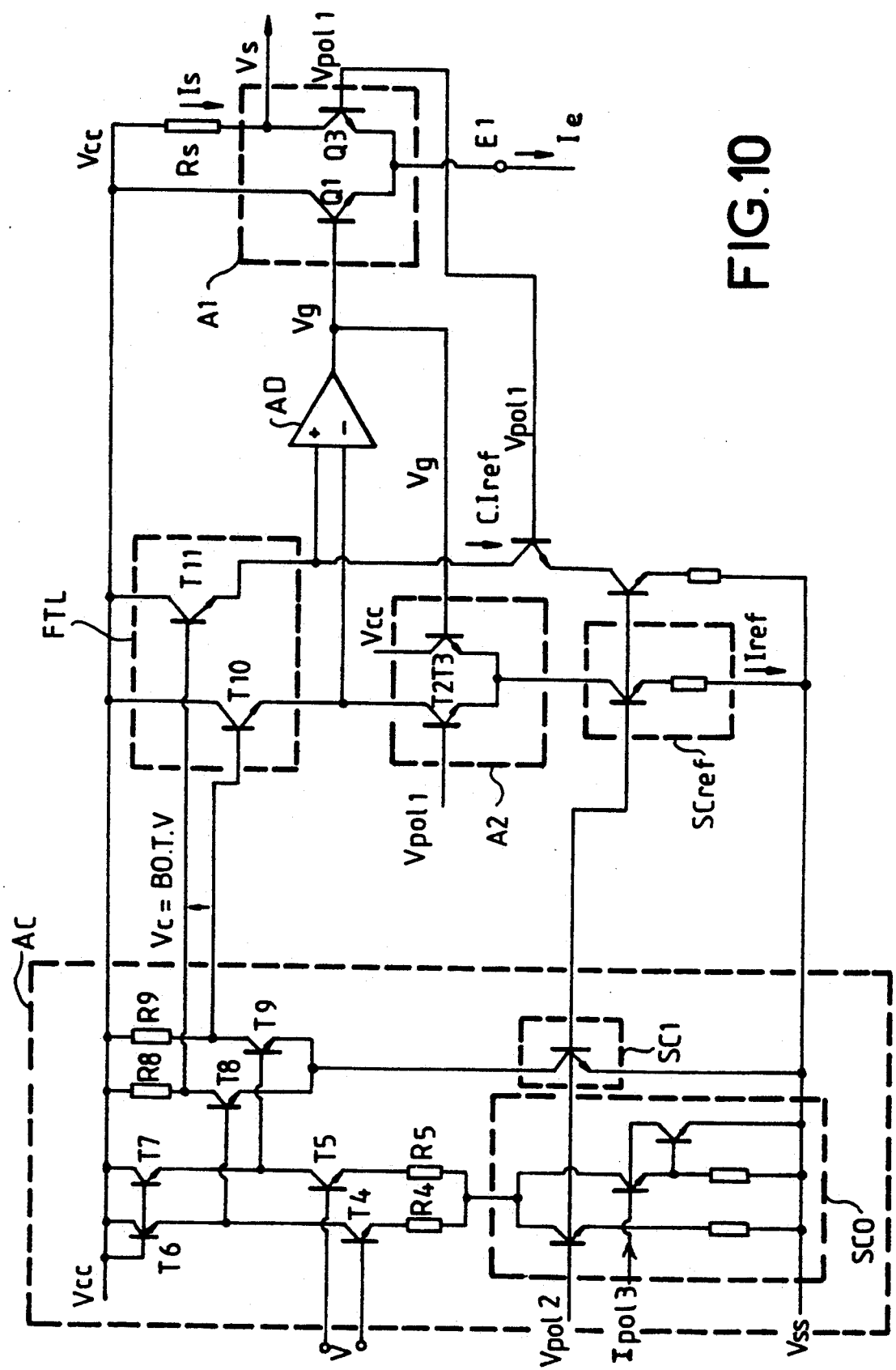
FIG. 10 represents a detailed diagram of an embodiment of the invention.

A detailed overall diagram of the embodiment described has been represented in FIG. 10. This diagram repeats the elements of FIGS. 6 to 9, optionally supplementing them; the references are the same as in FIGS. 6 to 9. Bias voltages Vpol2 and Vpol3 have been represented in addition to the voltage Vpol1; they serve to feed the bases of transistors which constitute current sources, in particular the sources SCref,SCref1 SC0 and SC1.

In FIG. 10 has been assumed that the input of the amplifying circuit is a current input (Ie) and that the output is a voltage output Vs. For this purpose, with respect to the diagram of cell A1 of FIG. 6, a resistor Rs has been added in FIG. 10 between Vcc and the collector of Q3, and the voltage output is taken at the junction point of Q3 and Rs.

Moreover, if the input of the amplifying circuit of FIG. 10 were desired to be a voltage input, a voltage-current conversion stage would be added upstream of the input El of the cell A1.

If finally an amplifying circuit is desired having, for example, a differential voltage input and a differential voltage output, provision can be made for two cells such as A1 operating in parallel and both controlled by the amplifier AD, receiving input currents from two differential branches of a stage with differential voltage input, the cells providing output currents to two resistors such as Rs. The output is formed in differential mode between the two resistors.

Figure 11:
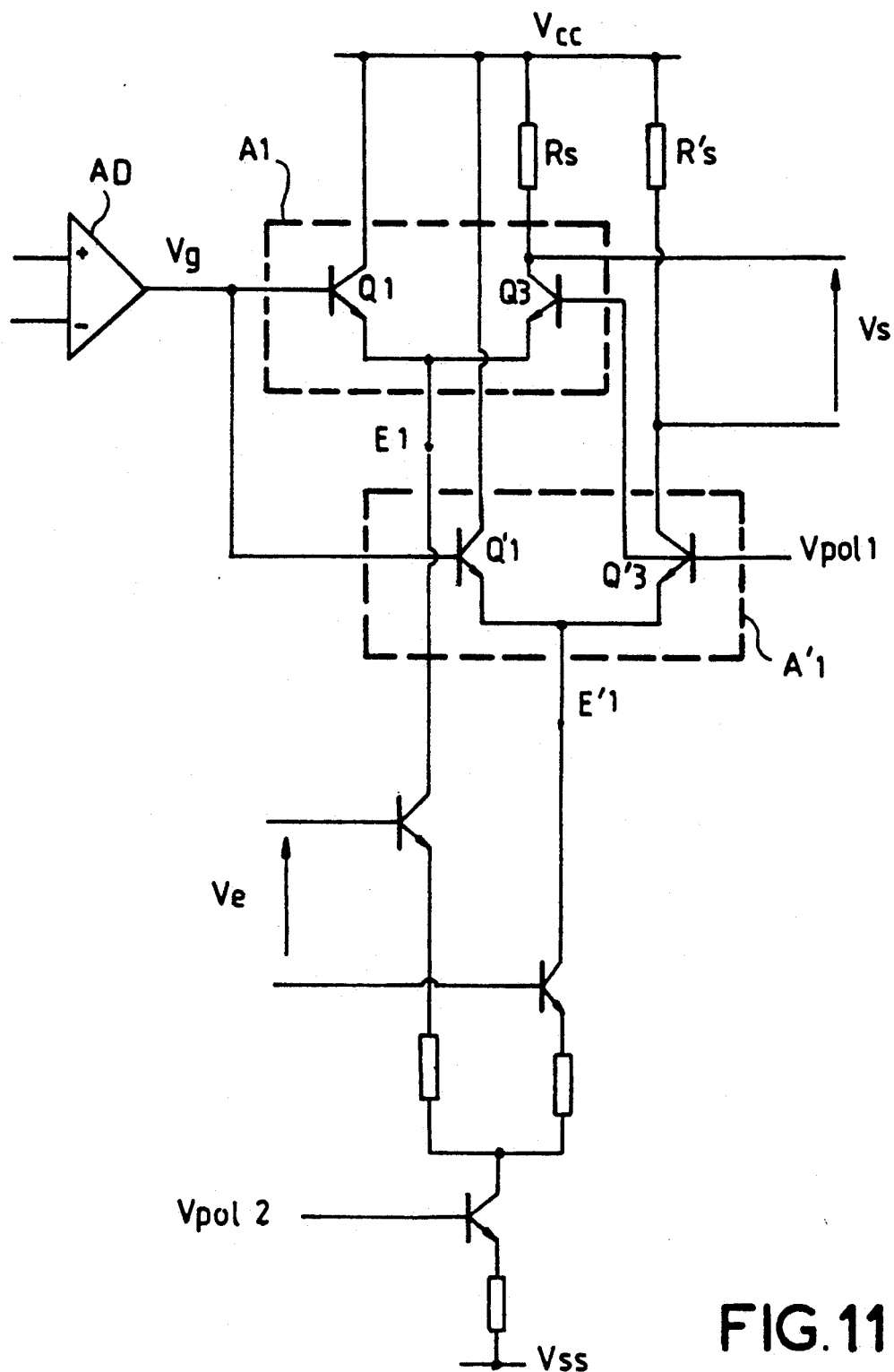
FIG. 11 represents a possible make-up of the output stage of the circuit according to the invention.

FIG. 11 represents this make-up of the amplifying circuit with two symmetrical cells A1 and A'1. The amplifiers AC, A2 and the element FTL are not repeated; they can be identical to those of FIG. 10.

I claim:

1. Amplifying circuit with gain controlled by an electrical gain set point signal, comprising two identical controlled-gain amplifiers (A1, A2) both receiving the same gain control signal (Vg), the first amplifier (A1) receiving a signal to be amplified and providing an amplified output signal, the second amplifier (A2) receiving a fixed reference signal to be amplified and providing at its output a signal proportional to this reference signal and to the gain (G) of the amplifiers, the circuit further comprising a gain set point signal input (Vc) and a feedback control loop receiving the output from the second amplifier (A2) and establishing the said gain control signal as a function of the set point signal, this loop comprising at least one large-gain differential amplifier (AD) whose differential input tends to be held at zero by the feedback control loop, characterized in that a circuit element with a logarithmic transfer function (FTL) is inserted into the feedback control loop between the output of the second amplifier (A2) and the input of the large-gain differential amplifier (AD).

2. Amplifying circuit according to claim 1, characterized in that the element with the logarithmic transfer function (FTL) establishes a signal proportional to the logarithm of the signal applied to its input.

3. Circuit according to claim 2, characterized in that the output of the element with the logarithmic transform function is applied to an input of the large-gain differential amplifier (AD), and the set point signal (Vc) is applied to another input of this differential amplifier.

4. Circuit according to claim 1 characterized in that the logarithmic transfer function is a linear combination of the logarithm of the output signal from the second amplifier and the set point signal, this combination being of the form Vc−p.Log(G)+constant, where p is a constant.

5. Circuit according to claim 4, characterized in that the output from the element with logarithmic transfer function (FTL) is applied in differential form between the inputs of the large-gain differential amplifier (AD).

6. Circuit according to claim 1, characterized in that the element with logarithmic transfer function includes two transistors (T10, T11), one fed by the current from the second amplifier, the other by a current proportional to the fixed reference signal applied to the input of the second amplifier, in that the gain set point signal (Vc) is a differential voltage between the bases of the two transistors, and in that the output from the element with logarithmic transfer function is the differential voltage between the emitters of these transistors.

7. Circuit according to any one of claims 1 to 6, characterized in that the identical amplifiers are current-current amplifiers each including a first transistor (Q1, T2) whose base is biased to a fixed voltage, a second transistor (T3, Q3) whose base receives the output from the differential amplifier (AD), the emitters of the two transistors being joined and the overall current applied to these emitters constituting the amplifier's input current, the collector of the second transistor (T3, Q3) being linked to a voltage-supply source (Vcc) and the current on the collector of the first transistor (Q1, T2) constituting the amplifier's output current.

8. Circuit according to any one of claims 1 to 7, characterized in that the identical amplifiers provide current outputs and in that the element with logarithmic transfer function includes at least one PN junction traversed by a current arising from the second amplifier.

9. Circuit according to any one of claims 1–8, characterized in that an amplifier with gain proportional to absolute temperature is placed ahead of the gain set point signal input.

* * * * *

UNITED STATES PATENT AND TRADEMARK OFFICE
CERTIFICATE OF CORRECTION

PATENT NO. : 5,278,518
DATED : January 11, 1994
INVENTOR(S) : Jean-Francois Debroux It is certified that error appears in the above-indentified patent and that said Letters Patent is hereby corrected as shown below:

On the title page, the PCT information has been omitted, should read as follows:

| Item [22] | PCT Filed: | Jan. 31, 1992 |
|---|---|---|
| Item [86] | PCT No.: | PCT/FR92/00088 |
| | § 371 Date: | Oct. 8, 1992 |
| | § 102(e) Date: | Oct. 8, 1992 |
| Item [87] | PCT Pub. No.: | WO92/14302 |
| | PCT Pub. Date: | Aug. 20, 1992-- |

Signed and Sealed this

Fourth Day of October, 1994

Attest:

BRUCE LEHMAN

Attesting Officer     Commissioner of Patents and Trademarks